US010057990B2

(12) United States Patent
Muro et al.

(10) Patent No.: US 10,057,990 B2
(45) Date of Patent: Aug. 21, 2018

(54) FLEXIBILE PRINTED CIRCUIT AND ELECTRONIC DEVICE

(71) Applicant: Kabushiki Kaisha Toshiba, Minato-ku, Tokyo (JP)

(72) Inventors: Kiyomi Muro, Hachioji Tokyo (JP); Chiari Shimizu, Fussa Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 15/347,632

(22) Filed: Nov. 9, 2016

(65) Prior Publication Data

US 2017/0135217 A1 May 11, 2017

Related U.S. Application Data

(60) Provisional application No. 62/254,047, filed on Nov. 11, 2015.

(51) Int. Cl.

| | |
|---|---|
| ***H05K 1/16*** | (2006.01) |
| ***H05K 1/18*** | (2006.01) |
| ***H05K 3/46*** | (2006.01) |
| ***G06F 1/16*** | (2006.01) |
| ***H05K 1/02*** | (2006.01) |

(52) U.S. Cl.

CPC ........... *H05K 1/189* (2013.01); *G06F 1/1633* (2013.01); *H05K 1/0298* (2013.01); *H05K 3/4611* (2013.01)

(58) Field of Classification Search

CPC .... H05K 1/189; H05K 1/0298; H05K 3/4611; G06F 1/1633

USPC ................................ 174/260, 250, 255–259

See application file for complete search history.

(56) References Cited

U.S. PATENT DOCUMENTS

2013/0299789 A1* 11/2013 Yamazaki ........... H01L 51/5246 257/40

FOREIGN PATENT DOCUMENTS

| | | |
|---|---|---|
| JP | 2007-204696 A | 8/2007 |
| JP | 2008-186851 A | 8/2008 |
| JP | 2008-198732 A | 8/2008 |
| JP | 2011-096984 A | 5/2011 |

* cited by examiner

*Primary Examiner* — Tremesha S Willis

(74) *Attorney, Agent, or Firm* — Knobbe, Martens, Olson & Bear, LLP

(57) ABSTRACT

According to one embodiment, a flexible printed circuit has a first circuit substrate and a second circuit substrate extending over the first circuit substrate. The first circuit substrate has a connector area. The second circuit substrate has an opening and an adhesive layer. The opening allows the connector area to be exposed. The opening has an opening edge which has a predetermined shape and defines the opening. The second circuit substrate has in the opening a depressed portion depressed deeper than the opening edge. Among various constituents of the second circuit substrate, at least the adhesive layer is depressed from the opening edge at the depressed portion.

16 Claims, 3 Drawing Sheets

FLEXIBILE PRINTED CIRCUIT AND ELECTRONIC DEVICE

CROSS-REFERENCE TO RELATED APPLICATIONS

This application claims the benefit of U.S. Provisional Application No. 62/254,047, filed Nov. 11, 2015, the entire contents of which are incorporated herein by reference.

FIELD

Embodiments described herein relate generally to a flexible printed circuit and an electronic device.

BACKGROUND

In the technical field of a flexible printed circuit (FPC), some measures are required to be taken against electromagnetic interference (EMI) in order to promote improvement in transmission characteristics or enhancement in transmission speed. In order to reduce EMI, a multilayer FPC is proposed. For example, it is proposed to place a signal layer between two GND layers. A general multilayer FPC is constituted by placing two or more circuit substrates one upon another. The circuit substrates placed one upon another are bonded together by adhesive layers, each containing adhesive and spreading over between any two adjacent circuit substrates.

Here, adhesive may partially exude from any adhesive layer by the pressure exerted to bond the circuit substrates together. If a large quantity of adhesive should exude, some of the exuded adhesive may spread over a connector area to which electronic components are connected. Then, poor connection of electronic components may arise, and the yield in the manufacture of FPCs may decrease.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings.

In general, according to one embodiment, a flexible printed circuit in the embodiment comprises a first circuit substrate and a second circuit substrate extending over the first circuit substrate. The first circuit substrate has a connector area. The second circuit substrate has an opening and an adhesive layer. The opening allows the connector area to be exposed to the outside. The opening has an opening edge which has a predetermined shape and defines the opening. The second circuit substrate has in the opening a depressed portion depressed deeper than the opening edge. Among various constituents of the second circuit substrate, at least the adhesive layer is depressed from the opening edge at the depressed portion.

STRUCTURE OF THE EMBODIMENT

[Electronic Device]

Figure 1:
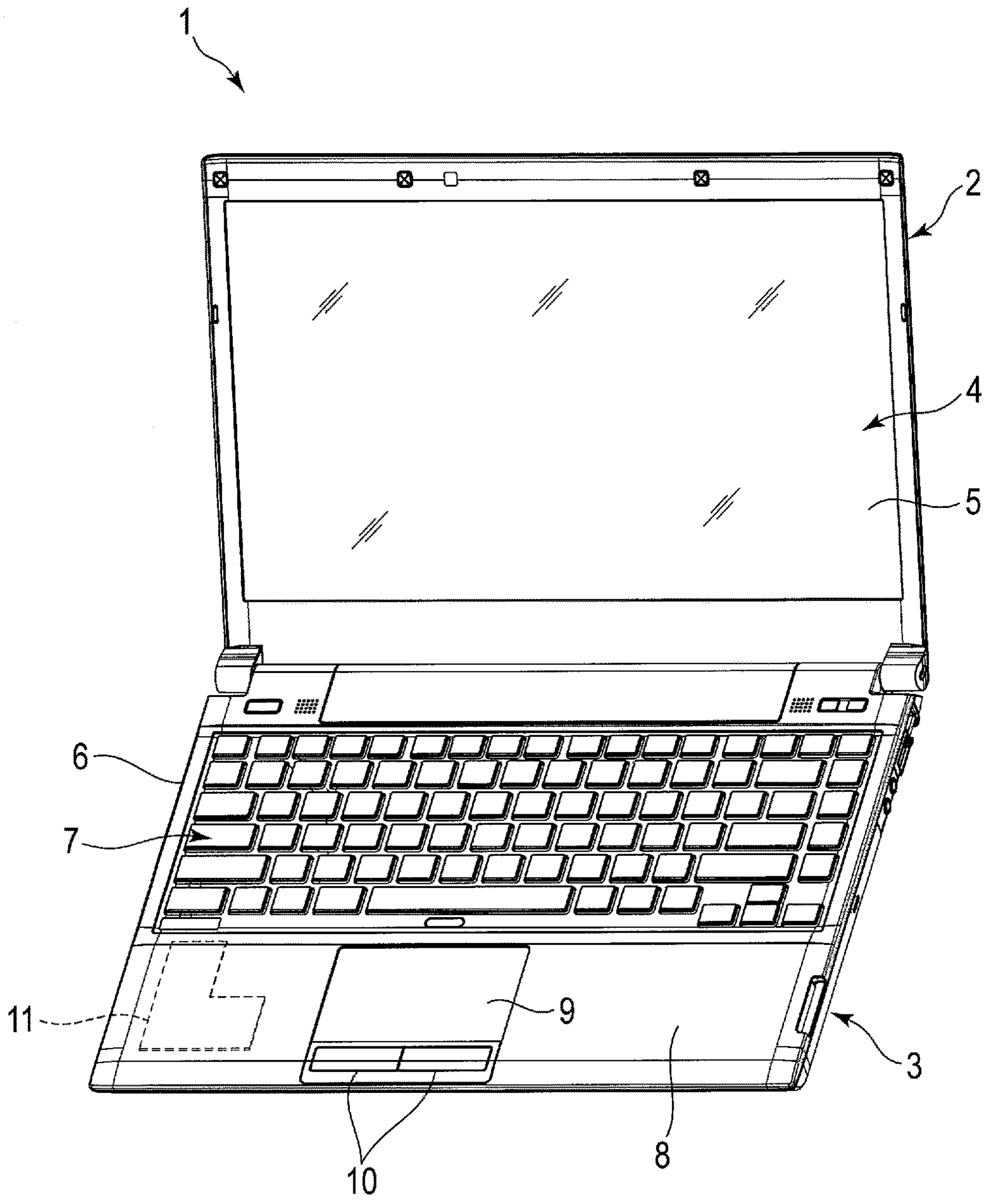
FIG. 1 is an exemplary perspective view illustrating the external appearance of an electronic device in one embodiment.

FIG. 1 illustrates a notebook computer 1 as an exemplary electronic device into which a flexible printed circuit is incorporated. The notebook computer 1 comprises a display unit 2 and a main unit 3.

The display unit 2 takes the form of a thin (flat) box. The display unit 2 includes a display module 4. A good example of the display module 4 may be a liquid crystal display, which is illustrated in FIG. 1. The liquid crystal display is provided with a screen 5 which can display an image (a static image or a dynamic image), a character, etc.

The main unit 3 comprises a case 6 in the form of a thin (flat) box. The case 6 has, for example, a keyboard 7, a palm rest 8, a touchpad 9, and a pair of buttons 10. The display unit 2 is attached to the main unit 3 in a freely openable and closable manner. The display unit 2 illustrated in FIG. 1 is in an open state. The open state makes it possible for a user to operate the keyboard 7 while looking at the screen 5 of the liquid crystal display, for example.

The case 6 accommodates various electronic components (not illustrated) and a flexible printed circuit 11 (FPC). For example, semiconductor chips, electrically connectable various slots, etc., may be enumerated as some examples of the electronic components. The FPC 11 is so constructed as to be connectable with at least one of such electronic components.

[FPC 11]

Figure 2:
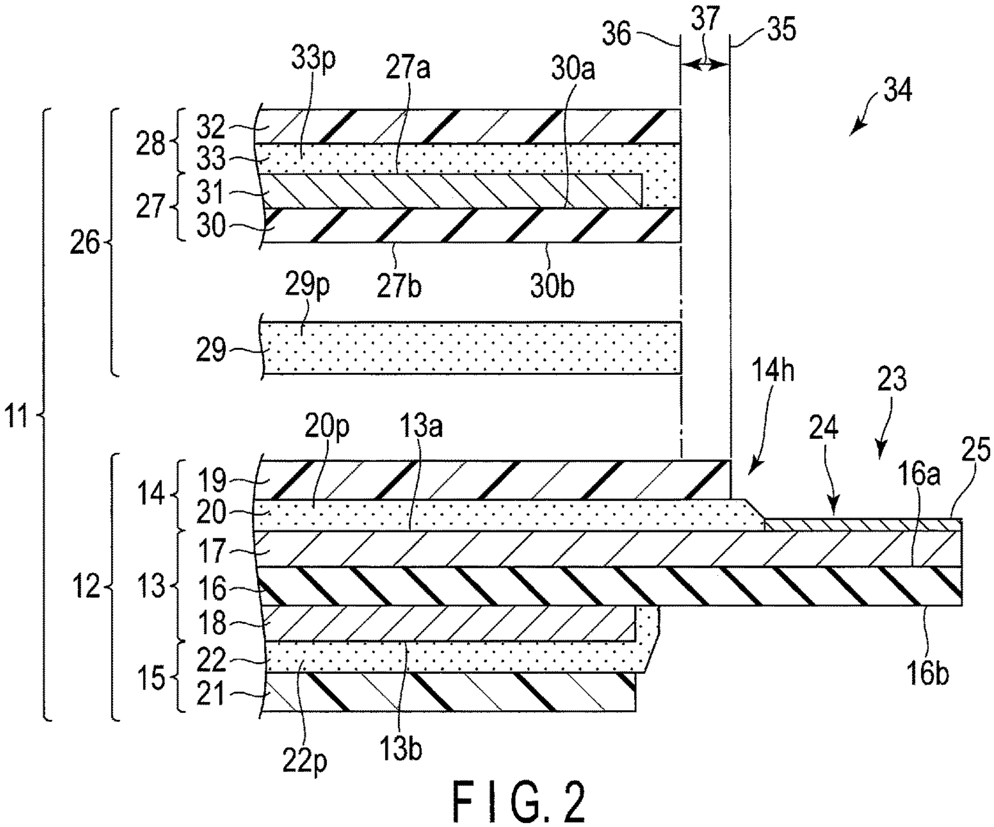
FIG. 2 is an exemplary exploded sectional view structurally illustrating a first circuit substrate and a second circuit substrate, each being a constituent of a flexible printed circuit in the embodiment.
Figure 3:
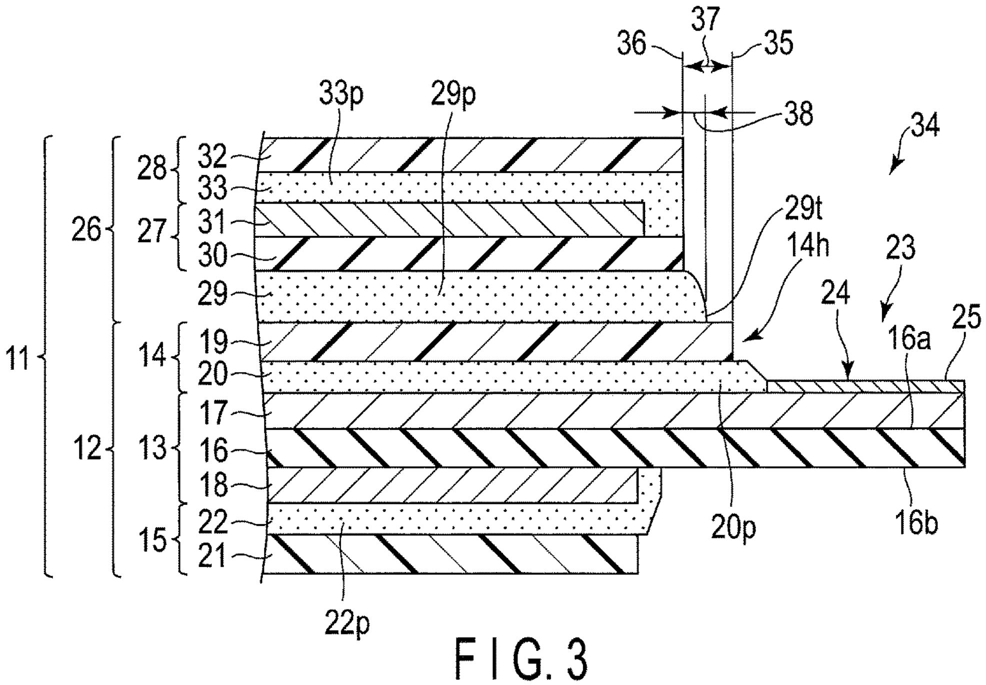
FIG. 3 is an exemplary sectional view illustrating a state where the first and second circuit substrates of FIG. 2 are bonded to each other.

The FPC 11 has a first circuit substrate 12 as illustrated in FIG. 2 and FIG. 3. The first circuit substrate 12 has flexibility. The first circuit substrate 12 has a first base layer 13, a first cover layer 14, and a second cover layer 15. The first base layer 13 has two surfaces **13*a* and 13*b* which are opposite to each other. The first cover layer 14 overlies one of the two surfaces of the first base layer 13 (one surface 13*a*, for instance). The second cover layer 15 overlies the other of the two surfaces of the first base layer 13 (the other surface 13*b***, for instance).

The first base layer 13 comprises a first insulating layer 16, a first conductive layer 17, and a second conductive layer 18. The first insulating layer 16 has two surfaces **16*a* and 16*b* which are opposite to each other. The first conductive layer 17 overlies one of the two surfaces of the first insulating layer 16 (one surface 16*a*, for instance). The first conductive layer 17 is covered by the first cover layer 14. The second conductive layer 18 overlies the other of the two surfaces of the first insulating layer 16 (the other surface 16*b*, for instance). The second conductive layer 18 is covered by the second cover layer 15. The first conductive layer 17 and the second conductive layer 18** are individually formed of metal material having conductivity, such as copper foil, for example.

The first cover layer 14 is so arranged as to extend over and be opposite to the first base layer 13 (the first conductive layer 17). The first cover layer 14 has a first cover layer proper 19 and a first adhesive layer 20. The first adhesive layer 20 comprises thermosetting adhesive 20_p_. The first cover layer proper 19 is bonded to the first base layer 13 (the first conductive layer 17) by the first adhesive layer 20 (adhesive 20_p_). In this way, the first cover layer 14 (the first cover layer proper 19) overlies the one surface 13_a_ of the first base layer 13.

The second cover layer 15 is so arranged as to extend over and be opposite to the first base layer 13 (the second conductive layer 18). The second cover layer 15 has a second cover layer proper 21 and a second adhesive layer 22. The second adhesive layer 22 comprises thermosetting adhesive 22_p_. The second cover layer proper 21 is bonded to the first base layer 13 (the second conductive layer 18) by the second adhesive layer (adhesive 22_p_). In this way, the second cover layer 15 (the second cover layer proper 21) overlies the other surface 13_b_ of the first base layer 13. It should be noted that a state where the second conductive layer 18 is wholly covered by the second adhesive layer 22 (adhesive 22_p_) is illustrated in the drawing as an example.

Here, the first insulating layer 16, the first cover layer proper 19, and the second cover layer proper 21 are formed of resin material which has an insulation property, such as polyimide, polyethylene terephthalate (PET), polyethylene naphthalate (PEN), etc., for example.

The first circuit substrate 12 has at least one connector area 23. Each connector area 23 has a predetermined conductor pattern 24. Each connector area 23 (each conductor pattern 24) is so constructed as to be electrically connectable with at least one of the above-mentioned electronic components. Each connector area 23 (each conductor pattern 24) is provided to a part of the first conductive layer 17.

Furthermore, the first circuit substrate 12 has at least one connecting hole 14_h_. More specifically, the first cover layer 14 that covers the first conductive layer 17 has at least one connecting hole 14_h_. The at least one connecting hole 14_h_ is equal in number to the at least one connector area 23 (the at least one conductor pattern 24). Each of the connecting hole 14_h_ is the same in shape and size as a corresponding the connector area 23 (the at least one conductor pattern 24). The connecting hole 14_h_ is made through the first cover layer 14 (the first cover layer proper 19 and the first adhesive layer 20). The connecting hole 14_h_ is positioned opposite to the connector area 23 (the conductor pattern 24) in the first cover layer 14 (the first cover layer proper 19 and the first adhesive layer 20).

Each of the at least one connecting hole 14_h_ is formed by partially removing the first cover layer 14 (which is a combination of the first cover layer proper 19 and the first adhesive layer 20) along the contour of the connecting hole 14_h_ concerned. Thereby, the connector area 23 (the conductor pattern 24) will be exposed to the outside through the connecting hole 14_h_. The conductor pattern 24 is covered by a metal layer 25 by gilding executed at the connector area 23. Gilding gives corrosive protection ability and wear resistance ability to the conductor pattern 24.

It should be noted that the conductor pattern 24 may be formed by applying to the connector area 23 any existing pattern formation technique, such as a subtractive process, for example. The first conductive layer 17 (copper foil) may be subjected to pattern processing by the use of etching, etc., for example, and will be formed to have a predetermined shape. This makes it possible that any of the above-mentioned electronic components (a semiconductor chip, for instance) will be mounted in any of the connector area 23 (the conductor pattern 24) and that the connector area 23 (the conductor pattern 24) will be electrically connected to various slots.

As illustrated in FIG. 2 and FIG. 3, the FPC 11 has a second circuit substrate 26 in addition to the first circuit substrate 12. The second circuit substrate 26 has flexibility. The second circuit substrate 26 is so arranged as to extend over and be opposite to the first circuit substrate 12. The second circuit substrate 26 has a second base layer 27, a third cover layer 28, and an adhesive layer 29 (namely, a fourth adhesive layer). The second base layer 27 has two surfaces 27_a_ and 27_b_ which are opposite to each other. The third cover layer 28 overlies one surface 27_a_ of the second base layer 27. The fourth adhesive layer 29 overlies the other surface 27_b_ of the second base layer 27.

The second base layer 27 has a second insulating layer 30 and a third conductive layer 31. The second insulating layer 30 has two surfaces 30_a_ and 30_b_ which are opposite to each other. The third conductive layer 31 overlies one surface 30_a_ of the second insulating layer 30. The third conductive layer 31 is covered by the third cover layer 28. The third conductive layer 31 is formed of metal material having conductivity, such as copper foil, for example.

The third cover layer 28 is so arranged as to extend over and be opposite to the second base layer 27 (the third conductive layer 31). The third cover layer 28 has a third cover layer proper 32 and a third adhesive layer 33. The third adhesive layer 33 comprises thermosetting adhesive 33_p_. The third cover layer proper 32 is bonded to the second base layer 27 (the third conductive layer 31) by the third adhesive layer 33 (adhesive 33_p_). In this way, the third cover layer 28 (the third cover layer proper 32) overlies the one surface 27_a_ of the second base layer 27. It should be noted that a state where the third conductive layer 31 is wholly covered by the third adhesive layer 33 (adhesive 33_p_) is illustrated in the drawing as an example.

The second insulating layer 30 and the third cover layer proper 32 are formed of resin material which has an insulation property. For example, polyimide, polyethylene terephthalate (PET), polyethylene naphthalate (PEN), etc., may be used for their formation.

The fourth adhesive layer 29 overlies the other surface 30_b_ of the second insulating layer 30 (the other surface 27_b_ of the second base layer 27). In other words, the fourth adhesive layer 29 extends over and is opposite to the first circuit substrate 12. The fourth adhesive layer 29 comprises thermosetting adhesive 29_p_. The first circuit substrate 12 and the second circuit substrate 26 are bonded to each other by the fourth adhesive layer 29 (adhesive 29_p_).

In an adhesion process, pressure acts on the first circuit substrate 12 and the second circuit substrate 26 in such a manner that the first circuit substrate 12 and the second circuit substrate 26 may approach to each other. What is more, while the pressure is applied, the fourth adhesive layer 29 (adhesive 29_p_) is heated. The adhesive 29_p_ of the fourth adhesive layer 29 receives heat and pressure. The adhesive 29_p_ melts and completely fills a space between the first circuit substrate 12 and the second circuit substrate 26. Then, the molten adhesive 29_p_ between the first circuit substrate 12 and the second circuit substrate 26 is cured. The two circuit substrates unite to form a single FPC 11 (FIG. 1).

⌊Opening 34⌋

Figure 4:
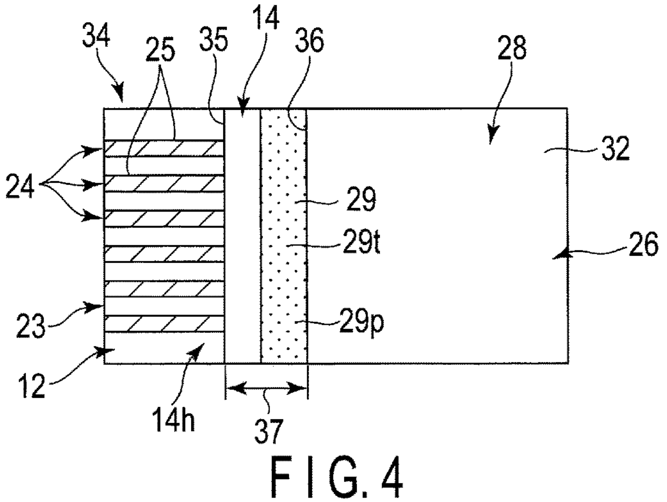
FIG. 4 is an exemplary plan view of the flexible printed circuit of FIG. 3.

As illustrated in FIG. 2 to FIG. 4, the FPC 11 has at least one opening 34. More specifically, the second circuit substrate 26 has at least one opening 34. The opening 34 is the same in number as the connecting hole 14_h_ of the first circuit substrate 12 (the connector area 23, the conductor pattern 24). The opening 34 is aligned with and is the same in shape and size as a corresponding the connecting hole 14*h* (the connector area 23, the conductor pattern 24).

The opening 34 extends through the second circuit substrate 26. More specifically, the opening 34 extends through the second base layer 27, the third cover layer 28, and the fourth adhesive layer 29. The opening 34 may be made by, for example, punching out the second circuit substrate 26 using a mold, or irradiating the second circuit substrate 26 with a laser beam, or subjecting the second circuit substrate 26 to etching.

The second circuit substrate 26 is bonded to the first circuit substrate 12 in such a manner that the opening 34 of the second circuit substrate 26 is positioned opposite to the connecting hole 14*h* of the first circuit substrate 12 (thereby causing the connector area 23 and the conductor pattern 24 to be exposed to the exterior). In other words, the connector area 23 (the conductor pattern 24) of the first circuit substrate 12 is exposed to the exterior through the opening 34.

Each of the opening 34 has an opening edge 35, which has a predetermined shape. Each of the opening edge 35 is made to have a shape in accordance with the shape of the connecting hole 14*h*. For example, when a rectangular solid semiconductor chip (an electronic component) must be connected to the FPC 11, the opening edge 35 is made to have a rectangular shape. Moreover, for example when the FPC 11 must be electrically connected to various slots (electronic components), the opening edge 35 is made to have a linear shape.

Furthermore, the second circuit substrate 26 has a depressed portion 36 in the opening 34. Any depressed portion 36 is deeper than the opening edge 35. Accordingly, the depressed portion 36 is more set back than the opening edge 35. In other words, the depressed portion 36 is offset from the opening edge 35. Hereafter, the range between the opening edge 35 and the depressed portion 36 is specified as an offset range 37.

The depressed portion 36 may be structurally classified into one of the following three variants.

First Variant:

The second circuit substrate 26 is arranged in such a manner that the fourth adhesive layer 29 (adhesive 29*p*) alone is depressed much deeper than the opening edge 35 but the second base layer 27 and the third cover layer 28 remain extending over to the opening edge 35.

Second Variant:

The second circuit substrate 26 is arranged in such a manner that some constituents of the second circuit substrate 26 including the fourth adhesive layer 29 (adhesive 29*p*) are depressed much deeper than the opening edge 35 but the rest remain extending over to the opening edge 35. The aforementioned some constituents of the second circuit substrate 26 that are depressed much deeper than the opening edge 35 may be, for example, one of the constituents of the second base layer 27 or a combination of all the constituents of the second base layer 27 and one of the constituents of the third cover layer 28.

Third Variant:

All constituents of the second circuit substrate 26 including the fourth adhesive layer 29 (adhesive 29*p*) are depressed much deeper than the opening edge 35. In this case, nothing exists that reaches the opening edge 35.

An exemplary third variant is illustrated in FIG. 4. What is specifically illustrated here is an opening 34 in the exemplary third variant. The connecting hole 14*h* (the connector area 23, the conductor pattern 24) exposed through the opening 34 is electrically connectable with various slots (electronic components) (FIG. 4). The opening edge 35 defining the opening 34 is formed to have a linear shape here. The depressed portion 36 is formed to have a linear shape.

In this structure, the fourth adhesive layer 29 between the second base layer 27 and the first cover layer 14 may be pressed and heated when the second circuit substrate 26 is bonded to the first circuit substrate 12 (the above-mentioned bonding process). At this moment, some adhesive 29*p* may exude from the fourth adhesive layer 29 and may flow over the depressed portion 36 into the opening 34. In this example, the extent to which the exuded adhesive 29*p* spreads out is restricted to within an offset range 37.

It should be noted that the offset range 37 may be established, for example, in accordance with an empirically obtained value. More specifically, the offset range 37 may be established in the following way. A bonding process is repeated several times. Each time the bonding process is repeated, how far the exuded adhesive 29*p* flows is measured. The average of the measurement results is calculated. The offset range 37 is finally established in accordance with the calculation result.

ADVANTAGE OF THE EMBODIMENT

In the present embodiment, the fourth adhesive layer 29 (adhesive 29*p*) between the second base layer 27 and the first cover layer 14 is pressed and heated when the second circuit substrate 26 is bonded to the first circuit substrate 12 in the above-mentioned bonding process. At the moment, some adhesive 29*p* may exude to run over (project from) any depressed portion 36 toward a corresponding opening 34. However, the exuding range 38 of the exuded portion (projected portion) 29*t* surely stays within a corresponding offset range 37 (FIG. 3). Therefore, any portion of the adhesive 29*p* will never spread over to the connector area 23 to which the electronic component is connected. Thereby, any defective connection of the electronic component will be prevented from occurring. The yield in the manufacture of FPCs 11 will be greatly improved.

The present embodiment makes it possible to cause the exuded portion (projected portion) 29*t* to stay between the opening edge 35 and the depressed portion 36 (namely, within an offset range 37). Accordingly, the circumference of the connector area 23 concerned, i.e., the section ranging from the opening edge 35 to the depressed portion 36, becomes a smooth slope which may smoothly change in a stepwise or tapered manner according to the projecting amount of the exuded (or projecting) portion 29*t*. This makes it possible to distribute over the slope any stress which may be produced around the connector area 23 when an FPC 11 is bent or stretched. In short, any stress can be prevented from concentrating on the circumference of the connector area 23. As a result, the FPC 11 will be prevented from being folded.

The present embodiment makes it possible to expose any portions of an intermediate layer as at least one conductor pattern 24 at any of the at least one connector area 23. This surely eliminates the need to make through-holes (not illustrated) to occasionally connect a front layer and a back layer. As a result, deterioration of transmission characteristics will surely be suppressed.

MODIFICATIONS OF THE EMBODIMENT

Figure 5:
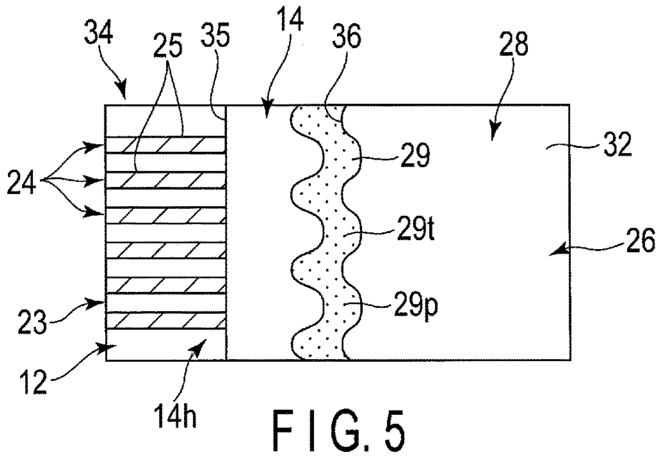
FIG. 5 is an exemplary plan view of a flexible printed circuit in a modification of the embodiment.

As illustrated in FIG. 5, the depressed portion 36 may be formed in the opening 34 to have a curvilinear shape. In this case, any stress produced around the connector area 23 (namely, the opening edge 35) when the FPC 11 is bent or stretched will be distributed over the curvilinear depressed portion 36. Accordingly, any stress will surely be prevented from concentrating on the circumference of the opening 34. The FPC 11 will be prevented from being folded.

Figure 6:
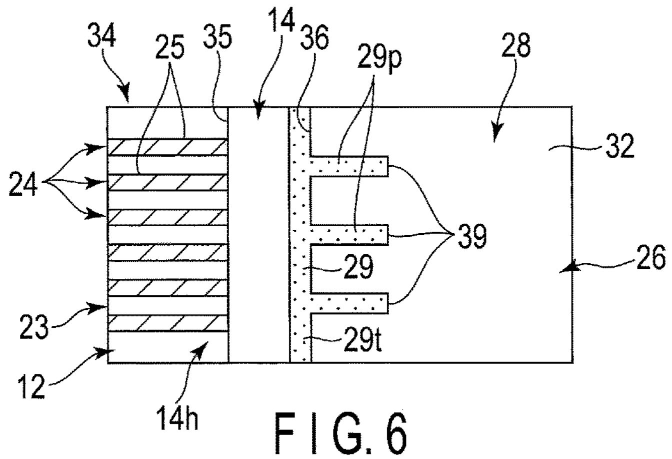
FIG. 6 is an exemplary plan view of a flexible printed circuit in a further modification of the embodiment.

As illustrated in FIG. 6, the second circuit substrate 26 may have at least one deeply depressed portion 39 in the opening 34. Any deeply depressed portion 39 is in the depressed portion 36 and is much deeper than the depressed portion 36. Three deeply depressed portions 39, each having a rectangular shape, are illustrated in the drawing as an example. In this structure, some adhesive 29*p*, which has exuded because of the above-mentioned adhesion process, may flow into the deeply depressed portions 39. This makes it possible to restrict the spreading range of the exuding portions (projected portions) 29*t*. As a result, the connector area 23 (the conductor pattern 24) will be prevented from being contaminated by the adhesive 29*p*.

It should be noted that the shape of any of the deeply depressed portions 39 is not confined to a rectangle. An arc, a triangle, and a polygon, for example, may be applicable as the shape of any of the deeply depressed portions 39. Furthermore, the linear depressed portion 36 may be replaced by the curvilinear depressed portion 36 (FIG. 5). Alternatively, the depressed portion 36 may be formed to have a shape utilizing a linear shape and a curvilinear shape in combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible printed circuit comprising:
- a first flexible circuit substrate comprising at least one connector area electrically connectable to an electronic component; and
- a second flexible circuit substrate, opposite to and extending over the first flexible circuit substrate, and comprising constituents including:
- at least one opening configured to expose the at least one connector area of the first flexible circuit substrate, and comprising an opening edge comprising a first shape;
- an adhesive layer comprising adhesive, spread over a section facing the first flexible circuit substrate, and bonding the second flexible circuit substrate to the first flexible circuit substrate; and
- a depressed portion in the at least one opening and depressed more offset from the opening edge of the at least one opening, wherein
- at least the adhesive layer among the constituents of the second flexible circuit substrate, is depressed between the opening edge and the depressed portion at the depressed portion.

2. The flexible printed circuit of claim 1, wherein some of the constituents of the second flexible circuit substrate, comprising the adhesive layer, are depressed from the opening edge at the depressed portion in the at least one opening.

3. The flexible printed circuit of claim 1, wherein the depressed portion in the at least one opening of the second flexible circuit substrate comprises a linear shape.

4. The flexible printed circuit of claim 1, wherein the depressed portion in the at least one opening of the second flexible circuit substrate comprises a curvilinear shape.

5. The flexible printed circuit of claim 1, wherein the second flexible circuit substrate comprises at least one deeply depressed portion in the at least one opening, and every one of the at least one deeply depressed portion is depressed more deeply than the depressed portion.

6. The flexible printed circuit of claim 1, wherein the first flexible circuit substrate comprises:
- a first base layer comprising two surfaces opposite to each other;
- a first cover layer overlying one of the two surfaces of the first base layer; and
- a second cover layer overlying the other of the two surfaces of the first base layer,
- the first base layer comprises:
- a first insulating layer comprising two surfaces opposite to each other;
- a first conductive layer overlying one of the two surfaces of the first insulating layer, and covered by the first cover layer; and
- a second conductive layer overlying the other of the two surfaces of the first insulating layer, and covered by the second cover layer, wherein
- each of the at least one connector area comprises a conductor pattern being a constituent of the first conductive layer and electrically connected to the electronic component,
- the first cover layer covering the first conductive layer comprises a connecting hole passing through the first cover layer,
- the connecting hole and the at least one opening are opposite to and aligned with each other upon there being the second flexible circuit substrate overlying the first flexible circuit substrate.

7. The flexible printed circuit of claim 6, wherein the second flexible circuit substrate comprises:
- a second base layer comprising two surfaces opposite to each other; and
- a third cover layer overlying one of the two surfaces of the second base layer, and
- the adhesive layer overlies the other of the two surfaces of the second base layer, extends between the second base layer and the first cover layer, bonds the second flexible circuit substrate to the first flexible circuit substrate, and comprises an exuded portion having exuded to run over the depressed portion toward the at least one opening but having stayed between the depressed portion and the opening edge upon the second flexible circuit substrate having been bonded to the first flexible circuit substrate.

8. The flexible printed circuit of claim 7, wherein the second base layer comprises:
- a second insulating layer comprising two surfaces opposite to each other; and
- a third conductive layer overlying one of the two surfaces of the second insulating layer and covered by the third cover layer, and
- the adhesive layer overlies the other of the two surfaces of the second insulating layer.

9. An electronic device comprising:
- a case comprising:
  - various electronic components; and a flexible printed circuit comprising:

a first flexible circuit substrate comprising at least one connector area electrically connectable to an electronic component; and a second flexible circuit substrate, opposite to and extending over the first flexible circuit substrate, and comprising constituents including:

at least one opening configured to expose the at least one connector area of the first flexible circuit substrate and comprising an opening edge comprising a first shape;

an adhesive layer comprising adhesive, spread over a section facing the first flexible circuit substrate, and bonding the second flexible circuit substrate to the first flexible circuit substrate; and a depressed portion in the at least one opening and depressed more offset from the opening edge of the at least one opening, wherein at least the adhesive layer among the constituents of the second flexible circuit substrate, is depressed between the opening edge and the depressed portion at the depressed portion.

10. The electronic device of claim 9, wherein some of the constituents of the second flexible circuit substrate, comprising the adhesive layer, are depressed from the opening edge at the depressed portion in the at least one opening.

11. The electronic device of claim 9, wherein the depressed portion in each of the at least one opening of the second flexible circuit substrate comprises a linear shape.

12. The electronic device of claim 9, wherein the depressed portion in the at least one opening of the second flexible circuit substrate comprises a curvilinear shape.

13. The electronic device of claim 9, wherein the second flexible circuit substrate comprises at least one deeply depressed portion in the at least one opening, and every one of the at least one deeply depressed portion is depressed more deeply than the depressed portion.

14. The electronic device of claim 9, wherein the first flexible circuit substrate comprises:

a first base layer comprising two surfaces opposite to each other;

a first cover layer overlying one of the two surfaces of the first base layer; and a second cover layer overlying the other of the two surfaces of the first base layer, the first base layer comprises:

a first insulating layer comprising two surfaces opposite to each other;

a first conductive layer overlying one of the two surfaces of the first insulating layer, and covered by the first cover layer; and a second conductive layer overlying the other of the two surfaces of the first insulating layer, and covered by the second cover layer, wherein each of the at least one connector area comprises a conductor pattern being a constituent of the first conductive layer and electrically connected to the electronic component, the first cover layer covering the first conductive layer comprises a connecting hole passing through the first cover layer, the connecting hole and the at least one opening are opposite to and aligned with each other upon there being the second flexible circuit substrate overlying the first flexible circuit substrate.

15. The electronic device of claim 9, wherein the second flexible circuit substrate comprises:

a second base layer comprising two surfaces opposite to each other; and a third cover layer overlying one of the two surfaces of the second base layer, and the adhesive layer overlies the other of the two surfaces of the second base layer, extends between the second base layer and a first cover layer, bonds the second flexible circuit substrate to the first flexible circuit substrate, and comprises an exuded portion having exuded to run over the depressed portion toward the at least one opening but having stayed between the depressed portion and the opening edge upon the second flexible circuit substrate having been bonded to the first flexible circuit substrate.

16. The electronic device of claim 9, wherein a second base layer comprises:

a second insulating layer comprising two surfaces opposite to each other; and a third conductive layer overlying one of the two surfaces of the second insulating layer and covered by a third cover layer, and the adhesive layer overlies the other of the two surfaces of the second insulating layer.

* * * * *